(12) United States Patent
Gerber et al.

(10) Patent No.: US 10,177,099 B2
(45) Date of Patent: Jan. 8, 2019

(54) SEMICONDUCTOR PACKAGE STRUCTURE, PACKAGE ON PACKAGE STRUCTURE AND PACKAGING METHOD

(71) Applicant: Advanced Semiconductor Engineering, Inc., Kaohsiung (TW)

(72) Inventors: Mark Gerber, Sunnyvale, CA (US); Rich Rice, Sunnyvale, CA (US); Bradford Factor, Paris (FR)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/482,464

(22) Filed: Apr. 7, 2017

(65) Prior Publication Data

US 2017/0294389 A1     Oct. 12, 2017

Related U.S. Application Data

(60) Provisional application No. 62/319,619, filed on Apr. 7, 2016.

(51) Int. Cl.
*H01L 23/00* (2006.01)
*H01L 23/373* (2006.01)
(Continued)

(52) U.S. Cl.
CPC .......... *H01L 23/562* (2013.01); *H01L 23/373* (2013.01); *H01L 25/0657* (2013.01); *H01L 25/105* (2013.01); *H01L 25/50* (2013.01); H01L 2224/16225 (2013.01); H01L 2224/32145 (2013.01); H01L 2224/32225 (2013.01); H01L 2224/48091 (2013.01); H01L 2224/48145 (2013.01); H01L 2224/48227 (2013.01); H01L 2224/73204 (2013.01); H01L 2224/97 (2013.01); H01L 2225/0651 (2013.01); H01L 2225/06506 (2013.01); H01L 2225/06513 (2013.01); H01L 2225/06568 (2013.01);
(Continued)

(58) Field of Classification Search
CPC ................................................ H01L 2924/181
See application file for complete search history.

(56) References Cited

U.S. PATENT DOCUMENTS

| 5,483,421 | A | * | 1/1996 | Gedney | ................ | H01L 23/145 |
| | | | | | | 174/255 |
| 5,767,447 | A | * | 6/1998 | Dudderar | ................ | H01L 23/04 |
| | | | | | | 174/546 |

(Continued)

*Primary Examiner* — Thao P Le
(74) *Attorney, Agent, or Firm* — Foley & Lardner LLP; Cliff Z. Liu

(57) ABSTRACT

A semiconductor package structure includes a substrate, a first semiconductor device, a first encapsulant and a second encapsulant. The substrate has a first coefficient of thermal expansion CTE1. The first semiconductor device is disposed adjacent to a first surface of the substrate. The first encapsulant is disposed on the first surface of the substrate, and covers at least a portion of the first semiconductor device. The first encapsulant has a second coefficient of thermal expansion CTE2. The second encapsulant is disposed on a second surface of the substrate and has a third coefficient of thermal expansion CTE3. A difference between CTE1 and CTE2 is substantially equal to a difference between CTE1 and CTE3.

21 Claims, 13 Drawing Sheets

(51) Int. Cl.
   *H01L 25/065* (2006.01)
   *H01L 25/00* (2006.01)
   *H01L 25/10* (2006.01)

(52) U.S. Cl.
   CPC ........... *H01L 2225/06572* (2013.01); *H01L 2225/06582* (2013.01); *H01L 2225/1023* (2013.01); *H01L 2225/1058* (2013.01); *H01L 2924/15311* (2013.01); *H01L 2924/15331* (2013.01); *H01L 2924/181* (2013.01); *H01L 2924/18161* (2013.01); *H01L 2924/3511* (2013.01)

(56) References Cited

U.S. PATENT DOCUMENTS

| | | | | |
|---|---|---|---|---|
| 6,013,109 | A * | 1/2000 | Choi | H01L 23/3135 257/E23.126 |
| 8,304,900 | B2 | 11/2012 | Jang et al. | |
| 8,393,222 | B2 * | 3/2013 | Crivelli | G01L 9/0052 361/283.4 |
| 8,541,299 | B2 * | 9/2013 | Buchwalter | H01L 21/563 257/E21.509 |
| 9,397,074 | B1 | 7/2016 | Lee et al. | |
| 9,842,776 | B2 * | 12/2017 | Nakka | H01L 23/3114 |

* cited by examiner

SEMICONDUCTOR PACKAGE STRUCTURE, PACKAGE ON PACKAGE STRUCTURE AND PACKAGING METHOD

CROSS-REFERENCE TO RELATED APPLICATIONS

This application claims the benefit of and priority to U.S. Provisional Patent Application No. 62/319,619, filed Apr. 7, 2016, the contents of which are incorporated herein by reference in its entirety.

BACKGROUND

1. Field of the Disclosure

The present disclosure relates to a semiconductor package structure, a package on package structure and a packaging method, and more particularly, to a semiconductor package structure including reduced warpage, a semiconductor package structure and a package on package structure including the same and a method for manufacturing the semiconductor package structure.

2. Description of the Related Art

A package on package (POP) structure generally includes a bottom package and a top package stacked on the bottom package. Currently, POP structures face a challenge in reducing warpage due to mismatches of coefficients of thermal expansion (CTE) between all components therein, especially when a total thickness of a bottom package is below about 1 millimeter (mm).

SUMMARY

In some aspects according to some embodiments, a semiconductor package structure includes a substrate, a first semiconductor device, a first encapsulant and a second encapsulant. The substrate has a first coefficient of thermal expansion CTE1. The first semiconductor device is disposed adjacent to a first surface of the substrate. The first encapsulant is disposed on the first surface of the substrate, and covers at least a portion of the first semiconductor device. The first encapsulant has a second coefficient of thermal expansion CTE2. The second encapsulant is disposed on a second surface of the substrate and has a third coefficient of thermal expansion CTE3. A difference between CTE1 and CTE2 is substantially equal to a difference between CTE1 and CTE3.

In some aspects according to some embodiments, a package on package structure includes a bottom package and a top package disposed on and electrically connected to the bottom package. The bottom package includes a bottom substrate, a first semiconductor device, a first encapsulant and a second encapsulant. The bottom substrate has a first surface and a second surface opposite to the first surface, and has a first coefficient of thermal expansion CTE1. The first semiconductor device is disposed adjacent to the first surface of the bottom substrate. The first encapsulant is disposed on the first surface of the bottom substrate, and covers at least a portion of the first semiconductor device. The first encapsulant has a second coefficient of thermal expansion CTE2. The second encapsulant is disposed on the second surface of the bottom substrate and has a third coefficient of thermal expansion CTE3. A difference between CTE1 and CTE2 is substantially equal to a difference between CTE1 and CTE3. The top package includes a top substrate, a top semiconductor device and a top encapsulant. The top substrate has a first surface and a second surface opposite to the first surface and a sixth coefficient of thermal expansion CTE6. The top semiconductor device is disposed adjacent to the first surface of the top substrate. The top encapsulant is disposed on the first surface of the top substrate, and covers at least a portion of the top semiconductor device. The top encapsulant has a seventh coefficient of thermal expansion CTE7, wherein CTE7 is substantially equal to CTE6.

In some aspects according to some embodiments, a packaging method includes: providing a substrate having a first coefficient of thermal expansion CTE1; mounting a first semiconductor device on a first surface of the substrate; disposing a first encapsulant on the first surface of the substrate and a second encapsulant on a second surface of the substrate, wherein the first encapsulant covers at least a portion of the first semiconductor device, the first encapsulant has a second coefficient of thermal expansion CTE2, the second encapsulant has a third coefficient of thermal expansion CTE3, and a difference between CTE1 and CTE2 is substantially equal to a difference between CTE1 and CTE3; and defining a first opening corresponding to a first connection pad disposed adjacent to the first surface of the substrate and a second opening corresponding a second connection pad disposed adjacent to a second surface of the substrate.

DETAILED DESCRIPTION

In a package on package ("POP") structure, two semiconductor package structures (e.g., a top package and a bottom package) are formed individually, and then are stacked (e.g., the top package is stacked on the bottom package). The top package includes a top package substrate, a top semiconductor device and a top encapsulant. A mismatch of coefficients of thermal expansion (CTEs) among the top package substrate, the top semiconductor device and the top encapsulant may result in warpage of the top package. The bottom package includes a bottom package substrate, a bottom semiconductor device and a bottom encapsulant. A mismatch of CTEs among the bottom package substrate, the bottom semiconductor device and the bottom encapsulant may result in warpage of the bottom package. Therefore, the electrical interconnection between the two semiconductor package structures (e.g., the top package and the bottom package) may be an issue, especially when the warpages of the top package and the bottom package occur, which results in a low yield rate of the POP structure.

This warpage challenge can be addressed with an improved structure that helps to reduce a mismatch of CTEs among encapsulant, semiconductor device and package substrate. The present disclosure describes, in some embodiments, a balanced CTE approach to reduce warpage of a semiconductor package, providing for low profile packaging. In addition, the present disclosure provides, in some embodiments, an improved bottom package substrate structure defining at least one through hole, and improved techniques for packaging methods. The bottom package substrate structure and techniques of some embodiments of the present disclosure are suitable for double side molding wherein multiple moldings are cured at the same time. In particular, the through hole can be designed to be at specific position. The opening of one end of the through hole can be within a first mold area on a first surface of the bottom package substrate structure, and the opening of the other end of the through hole can be within a second mold area on a second surface of the bottom package substrate structure. For example, the first mold area can be in communication (e.g., fluid communication) with the second mold area through the through hole. Thus, during the molding process, an encapsulant can be disposed on the second mold area, and can enter the first mold area through the through hole. Then, the encapsulant on the first mold area, in the through hole and on the second mold area can be cured at the same time. Therefore, a single thermal process can be conducted, and the bottom package substrate structure will be less likely to deform during the curing process of the molding compound.

Figure 1:
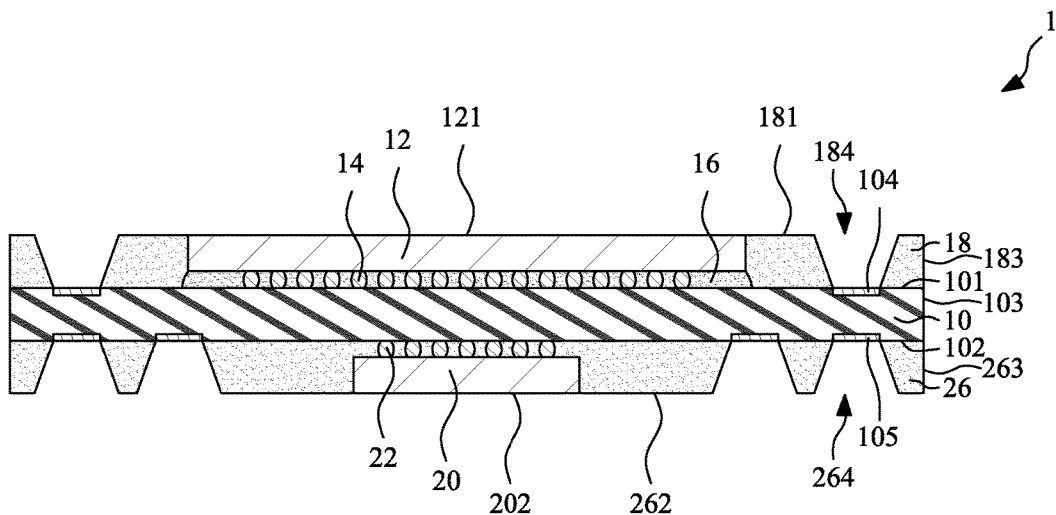
FIG. 1 illustrates a cross-sectional view of a semiconductor package structure according to one or more embodiments of the present disclosure.

FIG. 1 illustrates a cross-sectional view of a semiconductor package structure 1 according to one or more embodiments of the present disclosure. The semiconductor package structure 1 may be used as a bottom package of a POP structure, and includes a substrate 10, a first semiconductor device 12, a first encapsulant 18, a second semiconductor device 20 and a second encapsulant 26.

The substrate 10 can be a package substrate, and can have a first surface 101, a second surface 102 and a lateral surface 103. The second surface 102 is opposite to the first surface 101, and the lateral surface 103 extends between the first surface 101 and the second surface 102. In addition, the substrate 10 can include at least one first connection pad 104 and at least one second connection pad 105. The first connection pad 104 is disposed adjacent to the first surface 101 of the substrate 10, and the second connection pad 105 is disposed adjacent to the second surface 102 of the substrate 10. The material of the substrate 10 may be an organic substrate or an inorganic substrate. For example, the material of the substrate 10 may include a glass-reinforced epoxy resin material (e.g., FR4), bismaleimide triazine ("BT"), epoxy, silicon, printed circuit board ("PCB") material, glass or ceramic. A CTE of the substrate 10 is defined as CTE1 (e.g., a first CTE).

The first semiconductor device 12 is disposed adjacent to the first surface 101 of the substrate 10. In some embodiments, the first semiconductor device 12 is a semiconductor die, and is electrically connected to the first surface 101 of the substrate 10 through a plurality of first interconnection elements 14, such as bumps or pillars. For example, the first semiconductor device 12 may be attached to the first surface 101 of the substrate 10 by flip chip bonding. An underfill 16 may be further included in the space between the first semiconductor device 12 and the first surface 101 of the substrate 10 to surround and protect the first interconnection elements 14. A CTE of the first semiconductor device 12 is defined as CTE4 (e.g., a fourth CTE), and CTE4 is substantially equal to CTE1, such as |(CTE4−CTE1)/(CTE4+CTE1)|≤about 0.1, ≤about 0.05, or ≤about 0.01.

The first encapsulant 18 is disposed on the first surface 101 of the substrate 10, and covers at least a portion of the first semiconductor device 12. The material of the first encapsulant 18 may be a molding compound. The first encapsulant 18 has a first surface 181 and a side surface 183, and defines at least one first opening 184. The first surface 181 of the first encapsulant 18 is substantially coplanar with a first surface 121 of the first semiconductor device 12. For example, the first semiconductor device 12 may be exposed from the first encapsulant 18. The side surface 183 of the first encapsulant 18 may be substantially coplanar with the lateral surface 103 of the substrate 10. The position of the first opening 184 corresponds to or substantially aligns with the position of the first connection pad 104 so as to expose the first connection pad 104. For example, the first connection pad 104 is exposed from the first encapsulant 18. A CTE of the first encapsulant 18 is defined as CTE2 (e.g., a second CTE).

The second semiconductor device 20 is disposed adjacent to the second surface 102 of the substrate 10. In some embodiments, the second semiconductor device 20 is a semiconductor die, and is electrically connected to the second surface 102 of the substrate 10 through a plurality of second interconnection elements 22, such as bumps or pillars. For example, the second semiconductor device 20 may be attached to the second surface 102 of the substrate 10 by flip chip bonding. A portion of the second encapsulant 26 may further extend into the space between the second semiconductor device 20 and the second surface 102 of the substrate 10 to surround and protect the second interconnection elements 22 (e.g., a molded underfill (MUF)). In some embodiments, there may be an underfill disposed in the space between the second semiconductor device 20 and the second surface 102 of the substrate 10 to surround and protect the second interconnection elements 22. A CTE of the second semiconductor device 20 is defined as CTE5

(e.g., a fifth CTE), and CTE5 is substantially equal to CTE1, such as |(CTE5−CTE1)/(CTE5+CTE1)|≤about 0.1, ≤about 0.05, or ≤about 0.01.

The second encapsulant 26 is disposed on the second surface 102 of the substrate 10, and covers at least a portion of the second semiconductor device 20. The material of the second encapsulant 26 may be a molding compound. The second encapsulant 26 has a second surface 262 and a side surface 263, and defines at least one second opening 264. The second surface 262 of the second encapsulant 26 is substantially coplanar with a second surface 202 of the second semiconductor device 20. For example, the second semiconductor device 20 may be exposed from the second encapsulant 26. The side surface 263 of the second encapsulant 26 may be substantially coplanar with the lateral surface 103 of the substrate 10. Therefore, the side surface 183 of the first encapsulant 18, the side surface 263 of the second encapsulant 26 and the lateral surface 103 of the substrate 10 are substantially coplanar with each other. The position of the second opening 264 corresponds to or substantially aligns with the position of the second connection pad 105 so as to expose the second connection pad 105. For example, the second connection pad 105 is exposed from the second encapsulant 26. A CTE of the second encapsulant 26 is defined as CTE3 (e.g., a third CTE). In some embodiments, a thickness t1 of the first encapsulant 18 is substantially equal to a thickness t2 of the second encapsulant 26, such that |(t2−t1)/(t2+t1)|≤about 0.1, ≤about 0.05, or ≤about 0.01.

In some embodiments, a difference between CTE1 and CTE2 is substantially equal to a difference between CTE1 and CTE3, such as 0.9*|CTE3−CTE1|≤|CTE2−CTE1|≤1.1*|CTE3−CTE1|, or 0.99*|CTE3−CTE1|≤|CTE2−CTE1|≤1.01*|CTE3−CTE1|. In addition, CTE2 is substantially equal to CTE3, such as |(CTE3−CTE2)/(CTE3+CTE2)|≤about 0.1, ≤about 0.05, or ≤about 0.01. Further, CTE2 is substantially equal to CTE1, such as |(CTE2−CTE1)/(CTE2+CTE1)|≤about 0.1, ≤about 0.05, or ≤about 0.01; CTE3 is substantially equal to CTE1, such as |(CTE3−CTE1)/(CTE3+CTE1)|≤about 0.1, ≤about 0.05, or ≤about 0.01; and CTE4 is substantially equal to CTE5, such as |(CTE5−CTE4)/(CTE5+CTE4)|≤about 0.1, ≤about 0.05, or ≤about 0.01. However, in some embodiments, CTE2 may be different from CTE3, and CTE4 may be different from CTE5.

It is noted that a specific value of CTE of the above components can be achieved by selecting a specific size or material. In some embodiments, although two components may have approximately a same value of CTE, the components may include different materials. In some embodiments, the use of components (e.g., the first encapsulant 18 and the second encapsulant 26) with similar CTE values (e.g., CTE2 and CTE3) serves to reduce warpage of the semiconductor package structure 1, as well as reducing overall POP structure warpage. In some embodiments, CTE2 or CTE3 is higher than CTE1, and the determination of CTE1 should balance out the difference of CTE2 (or CTE3) to CTE1. In some embodiments, the difference of CTE2 to CTE1 should balance out the difference of CTE3 to CTE1 so as to reduce warpage of the semiconductor package structure 1. In some embodiments, the underfill (having a CTE) disposed under the first semiconductor device 12 and/or the second semiconductor device 20 on one or two sides of the substrate 10 can further reduce warpage of the semiconductor package structure 1, due to a balancing effect of the underfill on the semiconductor package structure 1.

Figure 2:
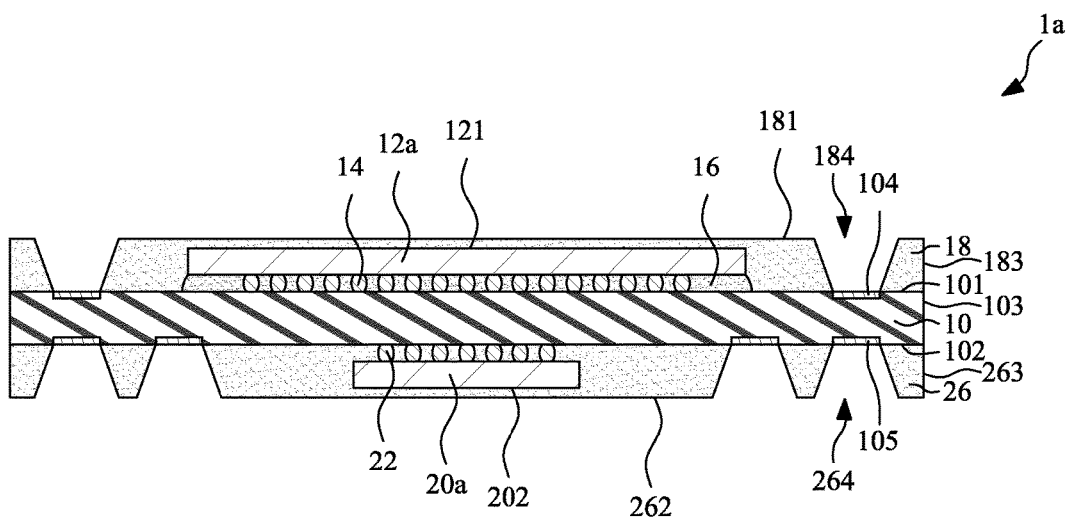
FIG. 2 illustrates a cross-sectional view of a semiconductor package structure according to one or more embodiments of the present disclosure.

FIG. 2 illustrates a cross-sectional view of a semiconductor package structure 1a according to one or more embodiments of the present disclosure. The semiconductor package structure 1a is similar to the semiconductor package structure 1 as shown in FIG. 1 in some respects, but differs at least in the sizes of the first semiconductor device 12a and the second semiconductor device 20a. The thickness of the first semiconductor device 12a of FIG. 2 is less than the thickness of the first semiconductor device 12 of FIG. 1, so that the first surface 121 of the first semiconductor device 12a is covered by the first encapsulant 18. The thickness of the second semiconductor device 20a of FIG. 2 is less than the thickness of the second semiconductor device 20 of FIG. 1, so that the second surface 202 of the second semiconductor device 20a is covered by the second encapsulant 26.

Figure 3:
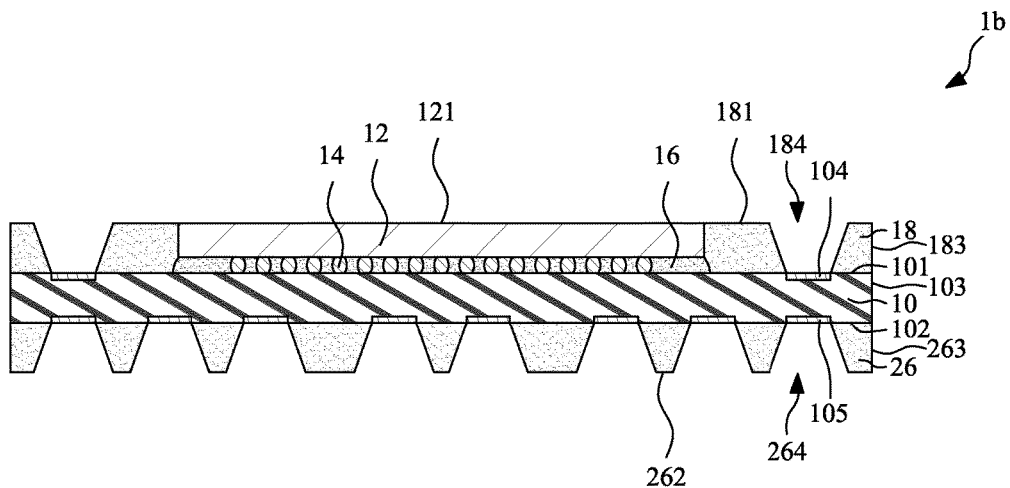
FIG. 3 illustrates a cross-sectional view of a semiconductor package structure according to one or more embodiments of the present disclosure.

FIG. 3 illustrates a cross-sectional view of a semiconductor package structure 1b according to one or more embodiments of the present disclosure. The semiconductor package structure 1b is similar to the semiconductor package structure 1 as shown in FIG. 1 in some respects, but differs at least in that the second semiconductor device 20 is omitted, and a number of the second connection pads 105 is increased.

Figure 4:
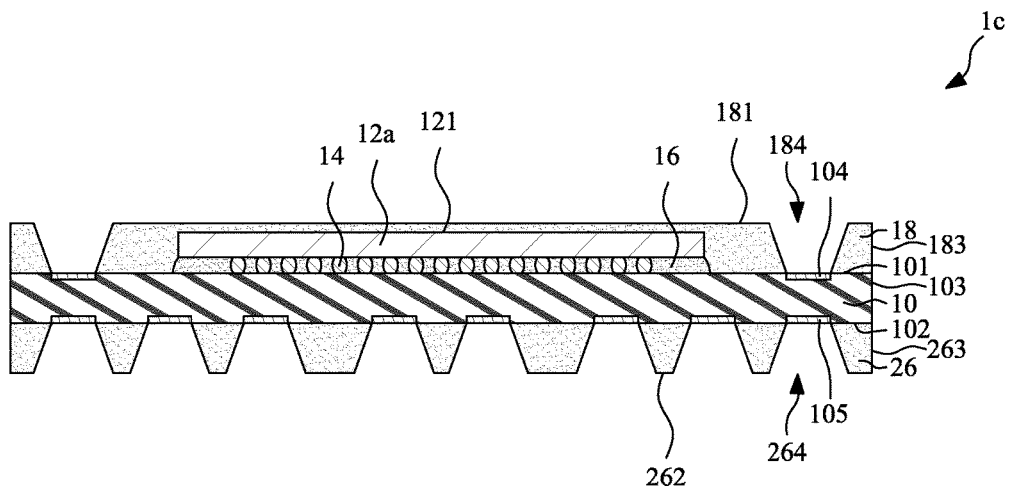
FIG. 4 illustrates a cross-sectional view of a semiconductor package structure according to one or more embodiments of the present disclosure.

FIG. 4 illustrates a cross-sectional view of a semiconductor package structure 1c according to one or more embodiments of the present disclosure. The semiconductor package structure 1c is similar to the semiconductor package structure 1b as shown in FIG. 3 in some respects, but differs at least in the size of the first semiconductor device 12a. The thickness of the first semiconductor device 12a of FIG. 4 is less than the thickness of the first semiconductor device 12 of FIG. 3, so that the first surface 121 of the first semiconductor device 12a is covered by the first encapsulant 18.

Figure 5:
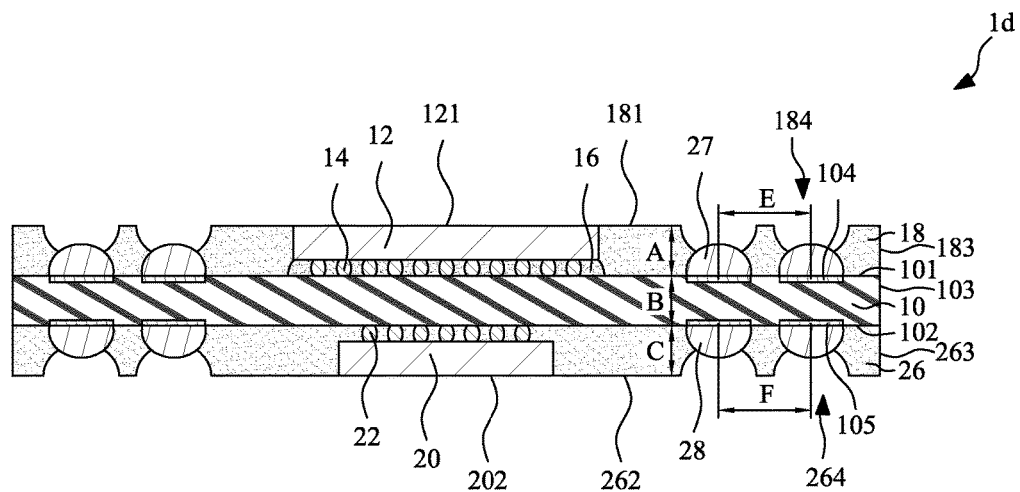
FIG. 5 illustrates a cross-sectional view of a semiconductor package structure according to one or more embodiments of the present disclosure.

FIG. 5 illustrates a cross-sectional view of a semiconductor package structure 1d according to one or more embodiments of the present disclosure. The semiconductor package structure 1d is similar to the semiconductor package structure 1 as shown in FIG. 1 in some respects, but differs at least in that a first intermediate material 27 and a second intermediate material 28 are further included. The first intermediate material 27 (e.g., a pre-solder or solder ball) is disposed on the first connection pad 104. The position of the first opening 184 corresponds to or substantially aligns with the position of the first intermediate material 27 so as to expose a portion of the first intermediate material 27. For example, the first intermediate material 27 is exposed from the first encapsulant 18. The second intermediate material 28 (e.g., a pre-solder or solder ball) is disposed on the second connection pad 105. The position of the second opening 264 corresponds to or substantially aligns with the position of the second intermediate material 28 so as to expose a portion of the second intermediate material 28. For example, the second intermediate material 28 is exposed from the second encapsulant 26.

The semiconductor package structure 1d of FIG. 5 has a surface area of about 12 millimeters (mm)×12 mm, the first semiconductor device 12 has a surface area of about 8.9 mm×about 7.8 mm, and the second semiconductor device 20 has a surface area of about 6.8×about 6.6 mm, which are not intended to limit the scope of the claims appended hereto. A distance 'A' represents a thickness of the first encapsulant 18. A distance 'B' represents a thickness of the substrate 10. A distance 'C' represents a thickness of the second encapsulant 26. A total thickness of the semiconductor package structure 1d equals the sum of A, B and C. In FIG. 5, a distance 'E' represents a pitch of the first intermediate material 27, and a distance 'F' represents a pitch of the second intermediate material 28. In some embodiments, A=about 0.15 mm, B=about 0.15 mm, C=about 0.15 mm, E=about 0.40 mm, and F=about 0.40 mm.

Packages according to some embodiments of the present disclosure (e.g., semiconductor package structure 1d) have an improved warpage performance because the first encapsulant 18 and the second encapsulant 26 have approximately a same thickness, and because the first encapsulant 18 and the second encapsulant 26 have approximately a same CTE value.

Figure 6:
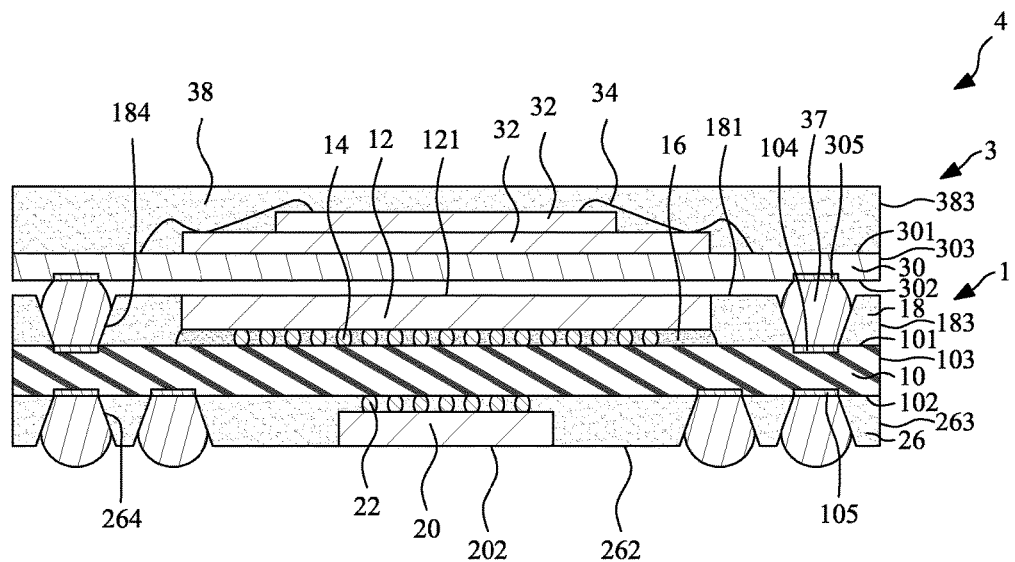
FIG. 6 illustrates a cross-sectional view of a package on package structure according to one or more embodiments of the present disclosure.

FIG. 6 illustrates a cross-sectional view of a package on package structure 4 according to one or more embodiments of the present disclosure. The package on package structure 4 includes a bottom package 1 and a top package 3. The bottom package 1 is the same as the semiconductor package structure 1 shown in FIG. 1, and includes the substrate 10 (the bottom substrate), the first semiconductor device 12, the first encapsulant 18, the second semiconductor device 20 and the second encapsulant 26. The top package 3 is disposed on and electrically connected to the bottom package 1, and includes a top substrate 30, one or more top semiconductor devices 32 and a top encapsulant 38.

The top substrate 30 can be a package substrate, and can have a first surface 301, a second surface 302 and a lateral surface 303. The second surface 302 is opposite to the first surface 301, and the lateral surface 303 extends between the first surface 301 and the second surface 302. In addition, the top substrate 30 can include at least one second connection pad 305. The second connection pad 305 is disposed adjacent to the second surface 302 of the top substrate 30. The material of the top substrate 30 may be an organic substrate or an inorganic substrate. For example, the material of the top substrate 30 may include a glass-reinforced epoxy resin material (e.g., FR4), BT, epoxy, silicon, PCB material, glass or ceramic. A CTE of the top substrate 30 is defined as CTE6 (e.g., a sixth CTE). In some embodiments, CTE6 may be substantially equal to CTE1, such as |(CTE6−CTE1)/(CTE6+CTE1)|≤about 0.1, ≤about 0.05, or ≤about 0.01; however, in other embodiments, CTE6 may be different from CTE1.

The top semiconductor device 32 is disposed adjacent to the first surface 301 of the top substrate 30. In some embodiments, the top semiconductor device 32 includes two semiconductor dies stacked on each other, and that are electrically connected to the first surface 301 of the top substrate 30 through a plurality of wires 34. For example, the top semiconductor device 32 may be attached to the first surface 301 of the top substrate 30 by wire bonding. A CTE of the top semiconductor device 32 is defined as CTE8 (e.g., an eight CTE), and CTE8 is substantially equal to CTE6, such as |(CTE8−CTE6)/(CTE8+CTE6)|≤about 0.1, ≤about 0.05, or ≤about 0.01.

The top encapsulant 38 is disposed on the first surface 301 of the top substrate 30, and covers at least a portion of the top semiconductor device 32. The material of the top encapsulant 38 may be a molding compound. The top encapsulant 38 has a side surface 383. The side surface 383 of the top encapsulant 38 may be substantially coplanar with the lateral surface 303 of the top substrate 30. In addition, the side surface 183 of the first encapsulant 18, the side surface 263 of the second encapsulant 26, the lateral surface 103 of the substrate 10 (e.g., the bottom substrate), the side surface 383 of the top encapsulant 38 and the lateral surface 303 of the top substrate 30 are substantially coplanar with each other. A CTE of the top encapsulant 38 is defined as CTE7 (e.g., a seventh CTE). CTE7 is substantially equal to CTE6, such as |(CTE7−CTE6)/(CTE7+CTE6)|≤about 0.1, ≤about 0.05, or ≤about 0.01. In some embodiments, CTE7 may be substantially equal to CTE2 (or CTE3); however, in other embodiments, CTE7 may be different from CTE2 (or CTE3).

In some embodiments, the top package 3 is connected to the bottom package 1 through a solder material 37. The solder material 37 connects the first connection pad 104 of the bottom package 1 and the second connection pad 305 of the top package 3.

In some embodiments, the use of components (e.g., the top encapsulant 38 and the top substrate 30) with similar CTE values (e.g., CTE7 and CTE6) serves to reduce warpage of the top package 3, as well as reducing warpage of the overall package on package structure 4. Therefore, the electrical interconnection between the two semiconductor package structures (e.g., the top package 3 and the bottom package 1) is not difficult, which results in a high yield rate of the package on package structure 4.

Figure 7:
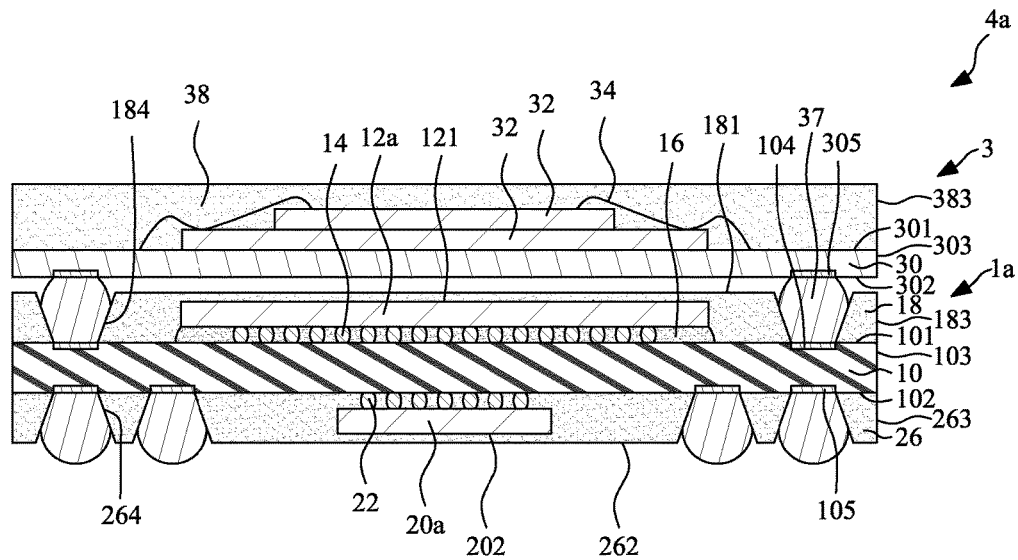
FIG. 7 illustrates a cross-sectional view of a package on package structure according to one or more embodiments of the present disclosure.

FIG. 7 illustrates a cross-sectional view of a package on package structure 4a according to one or more embodiments of the present disclosure. The package on package structure 4a is similar to the package on package structure 4 as shown in FIG. 6 in some respects, but differs at least in the sizes of the first semiconductor device 12a and the second semiconductor device 20a of the bottom package 1a. The thickness of the first semiconductor device 12a of FIG. 7 is less than the thickness of the first semiconductor device 12 of FIG. 6, so that the first surface 121 of the first semiconductor device 12a is covered by the first encapsulant 18. The thickness of the second semiconductor device 20a of FIG. 7 is less than the thickness of the second semiconductor device 20 of FIG. 6, so that the second surface 202 of the second semiconductor device 20a is covered by the second encapsulant 26.

Figure 8:
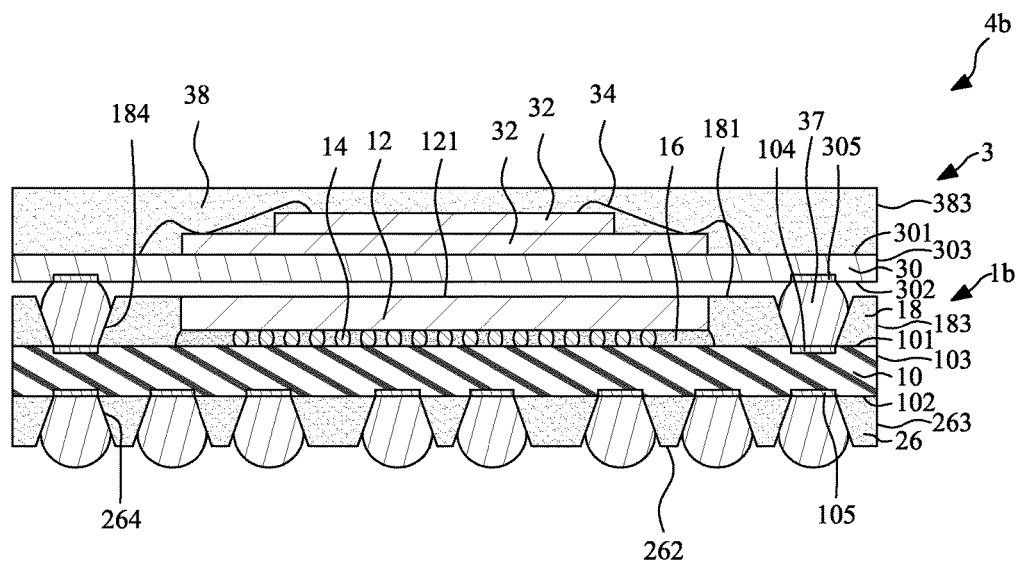
FIG. 8 illustrates a cross-sectional view of a package on package structure according to one or more embodiments of the present disclosure.

FIG. 8 illustrates a cross-sectional view of a package on package structure 4b according to one or more embodiments of the present disclosure. The package on package structure 4b is similar to the package on package structure 4 as shown in FIG. 6 in some respects, but differs at least in that the second semiconductor device 20 of the bottom package 1 is omitted, and a number of the second connection pads 105 of the bottom package 1b is increased.

Figure 9:
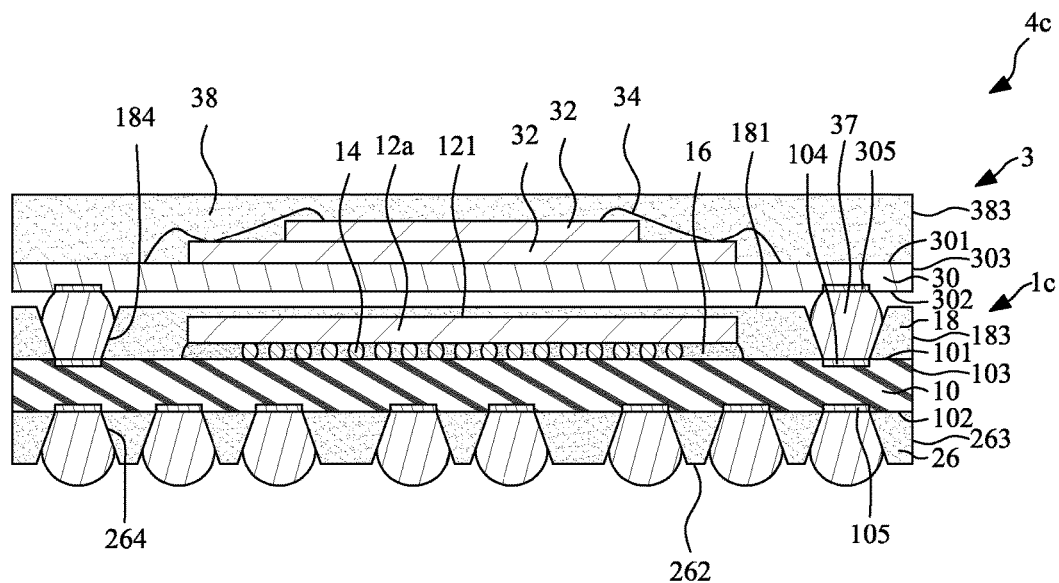
FIG. 9 illustrates a cross-sectional view of a package on package structure according to one or more embodiments of the present disclosure.

FIG. 9 illustrates a cross-sectional view of a package on package structure 4c according to one or more embodiments of the present disclosure. The package on package structure 4c may be similar to the package on package structure 4b as shown in FIG. 8 in some respects, but differs at least in the size of the first semiconductor device 12a. The thickness of the first semiconductor device 12a of FIG. 9 is less than the thickness of the first semiconductor device 12 of FIG. 8, so that the first surface 121 of the first semiconductor device 12a is covered by the first encapsulant 18.

Figure 10:
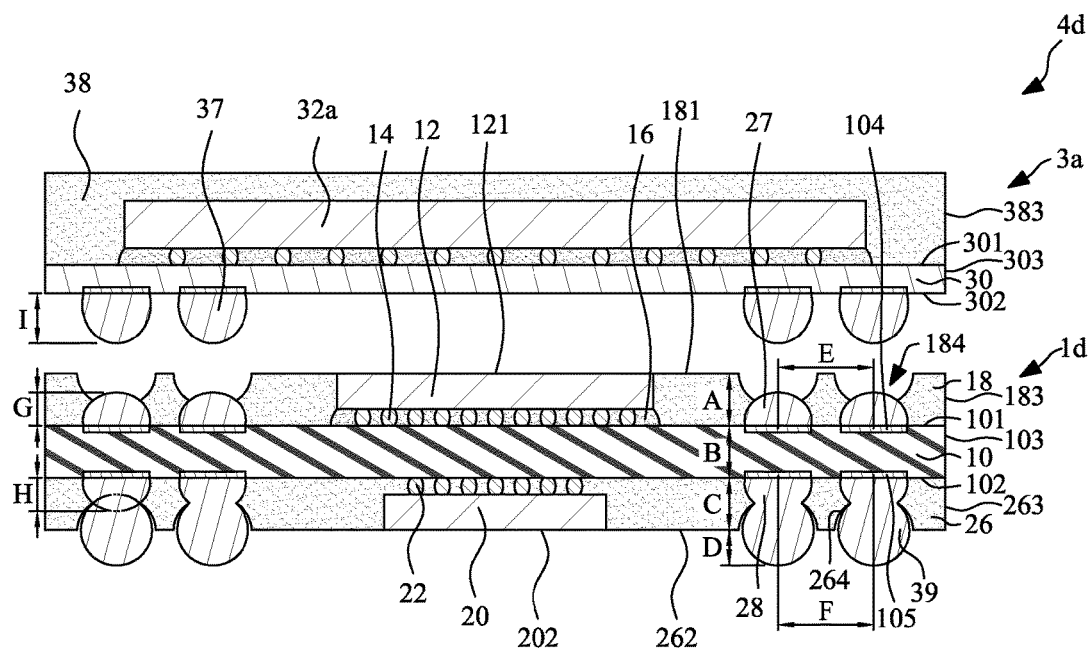
FIG. 10 illustrates a cross-sectional view of a package on package structure according to one or more embodiments of the present disclosure.

FIG. 10 illustrates a cross-sectional view of a package on package structure 4d in which the top package is to be stacked on the bottom package according to one or more embodiments of the present disclosure. The bottom package 1d is the same as the semiconductor package structure 1d shown in FIG. 5. A top semiconductor device 32a of a top package 3a may be a memory die, and may be attached to the first surface 301 of the top substrate 30 by flip chip bonding. A plurality of external connections 39 are disposed on the second intermediate material 28, and are fused together. A distance 'D' represents a standoff height of the external connection 39 protruding from the second surface 262 of the second encapsulant 26. A distance 'G' represents a height of the first intermediate material 27 before the top package 3a is stacked on the bottom package 1d. A distance 'H' represents a height of the second intermediate material 28 before the external connection 39 is disposed thereon.

The distance 'I' represents a standoff height of solder material 37 before the top package 3a is stacked on the bottom package 1d. In some embodiments, D=about 0.10 mm, G=about 0.10 mm, H=about 0.15 mm, and I=about 0.18 mm.

Figure 11:
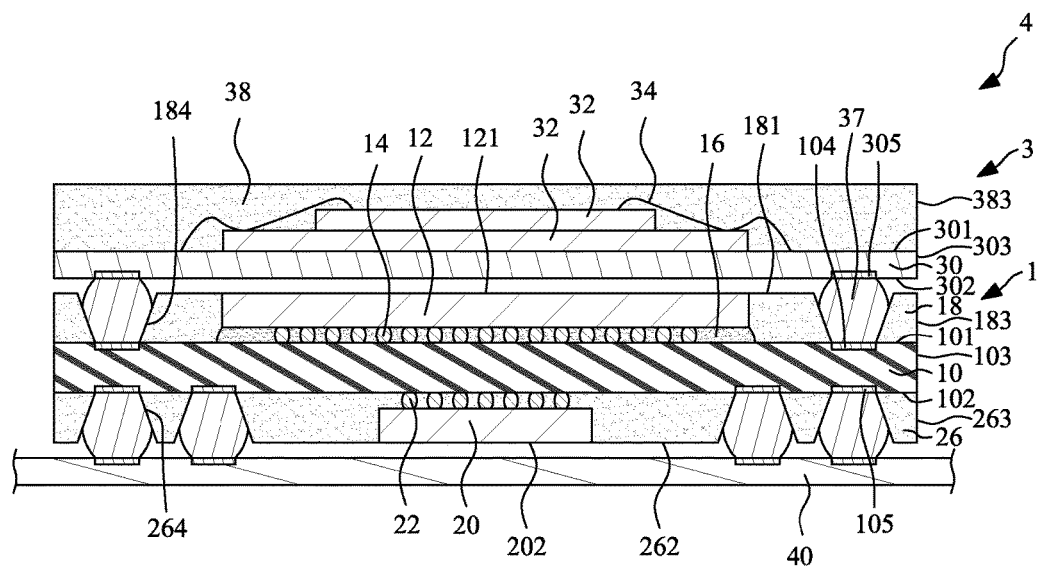
FIG. 11 illustrates a cross-sectional view of a package on package structure in which the package on package structure is mounted to a motherboard according to one or more embodiments of the present disclosure.

FIG. 11 illustrates a cross-sectional view of a package on package structure 4 in which the package on package structure 4 is mounted to a motherboard 40 according to one or more embodiments of the present disclosure. The package on package structure 4 of FIG. 11 is the same as the package on package structure 4 of FIG. 6, and is mounted to the motherboard 40 (e.g., PCB board) by, for example, surface mount technology (SMT). It is noted that package warpage can impact assembly yield, and the impact applies to both a top package-bottom package stack and a bottom package-PCB board stack. Since the warpage of the package on package structure 4 is improved, the SMT yield is also improved.

Figure 12:
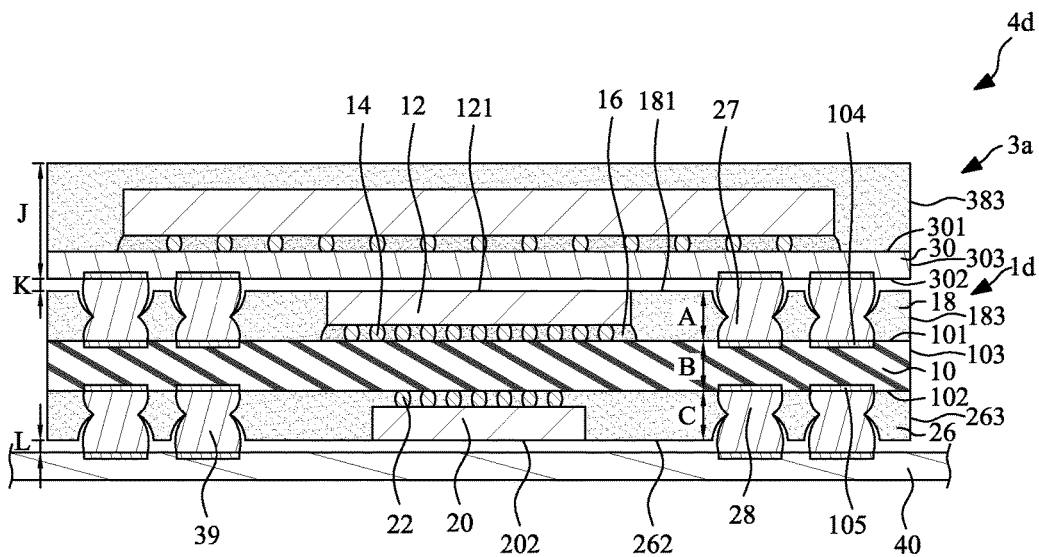
FIG. 12 illustrates a cross-sectional view of a package on package structure in which the package on package structure is mounted to a motherboard according to one or more embodiments of the present disclosure.

FIG. 12 illustrates a cross-sectional view of a package on package structure 4d in which the package on package structure 4d is mounted to a motherboard 40 according to one or more embodiments of the present disclosure. The package on package structure 4d of FIG. 12 is the same as the package on package structure 4d of FIG. 10, and is mounted to the motherboard 40 (e.g., PCB board) by, for example, SMT. A distance 'J' represents a thickness of the top package 3a. A distance 'K' represents a gap distance between the top package 3a and the bottom package 1d. A distance 'L' represents a gap distance between the bottom package 1d and the motherboard 40. The total package on package structure 4d thickness equals the sum of A, B, C, J, K, and L. In some embodiments, J=about 0.43 mm, K=about 0.05 mm, and L=about 0.05 mm, and the total package on package structure 4d thickness is substantially equal to about 1 mm. Furthermore, it is noted that package warpage can impact assembly yield, and the impact applies to both a top package-bottom package stack and a bottom package-PCB board stack. Since the warpage of the package on package structure 4d is improved, the SMT yield is also improved.

Figure 13:
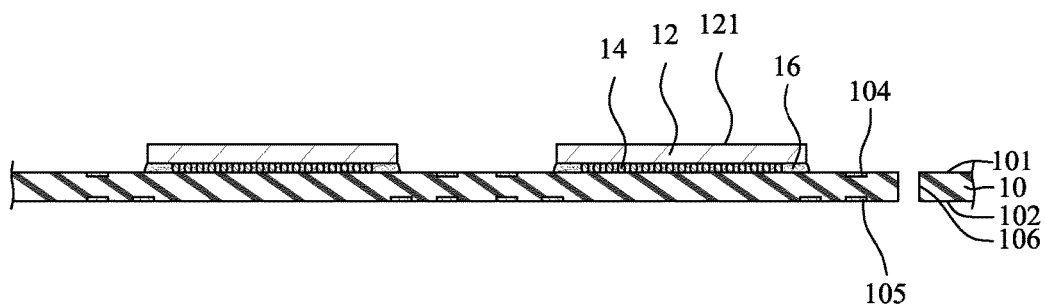
FIG. 13, FIG. 14, FIG. 15, FIG. 16, FIG. 17 and FIG. 18 illustrate a packaging method according to one or more embodiments of the present disclosure.

FIGS. 13-18 illustrate a packaging method according to one or more embodiments of the present disclosure. Referring to FIG. 13, a substrate 10 is provided. In some embodiments, the substrate 10 can be similar to the substrate 10 illustrated in FIG. 1, except that the substrate 10 of FIG. 13 can be a strip type substrate structure or a panel type substrate structure. The substrate 10 can be a package substrate, and can have a first surface 101 and a second surface 102 opposite to the first surface 101. In addition, the substrate 10 can include at least one first connection pad 104 and at least one second connection pad 105, and define at least one through hole 106 extending through the substrate 10. The first connection pad 104 is disposed adjacent to the first surface 101 of the substrate 10, and the second connection pad 105 is disposed adjacent to the second surface 102 of the substrate 10. The material of the substrate 10 may be an organic substrate or an inorganic substrate. For example, the material of the substrate 10 may include a glass-reinforced epoxy resin material (e.g., FR4), BT, epoxy, silicon, PCB material, glass or ceramic. A CTE of the substrate 10 is defined as CTE1.

Then, at least one first semiconductor device 12 is mounted on the first surface 101 of the substrate 10. In some embodiments, the first semiconductor device 12 is a semiconductor die, and is electrically connected to the first surface 101 of the substrate 10 through a plurality of first interconnection elements 14, such as bumps or pillars. For example, the first semiconductor device 12 may be attached to the first surface 101 of the substrate 10 by flip chip bonding. An underfill 16 may be optionally applied in the space between the first semiconductor device 12 and the first surface 101 of the substrate 10 to surround and protect the first interconnection elements 14. A CTE of the first semiconductor device 12 is defined as CTE4, and CTE4 is substantially equal to CTE1, such as |(CTE4−CTE1)/(CTE4+CTE1)|≤about 0.1, ≤about 0.05, or ≤about 0.01.

Figure 14:
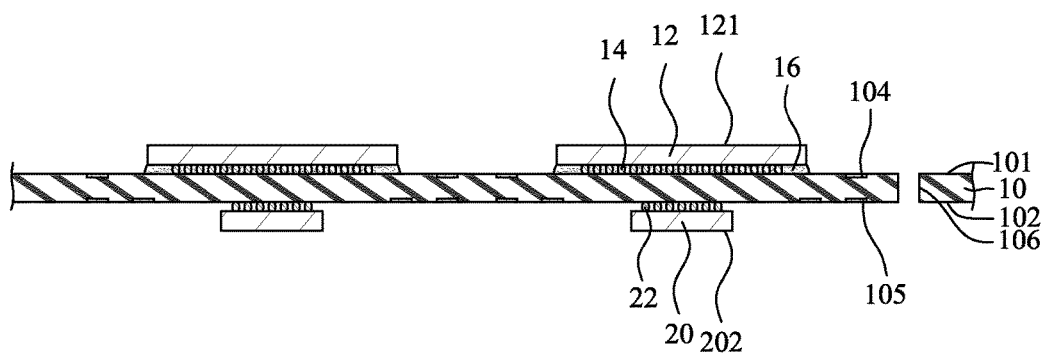

Referring to FIG. 14, at least one second semiconductor device 20 is mounted on the second surface 102 of the substrate 10. In some embodiments, the second semiconductor device 20 is a semiconductor die, and is electrically connected to the second surface 102 of the substrate 10 through a plurality of second interconnection elements 22, such as bumps or pillars. For example, the second semiconductor device 20 may be attached to the second surface 102 of the substrate 10 by flip chip bonding. In some embodiments, there may be an underfill applied in the space between the second semiconductor device 20 and the second surface 102 of the substrate 10 to surround and protect the second interconnection elements 22. A CTE of the second semiconductor device 20 is defined as CTE5, and CTE5 is substantially equal to CTE1, such as |(CTE5−CTE1)/(CTE5+CTE1)|≤about 0.1, ≤about 0.05, or ≤about 0.01.

Figure 15:
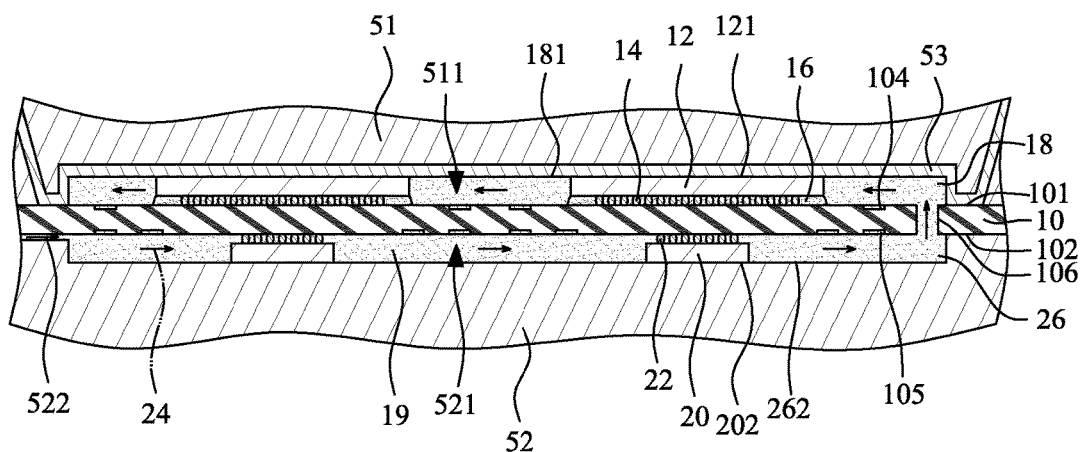

Referring to FIG. 15, a first encapsulant 18 is formed or disposed on the first surface 101 of the substrate 10 and a second encapsulant 26 is disposed on the second surface 102 of the substrate 10. The first encapsulant 18 covers at least a portion of the first semiconductor device 12, and the second encapsulant 26 covers at least a portion of the second semiconductor device 20. In some embodiments, the first encapsulant 18 and the second encapsulant 26 are formed or disposed concurrently during one stage, which is referred to as "double side molding," described as follows.

A first mold chase 51, a second mold chase 52 and an upper molding film 53 are provided. The substrate 10 is sandwiched between the first mold chase 51 and the second mold chase 52. The first mold chase 51 defines a first cavity 511, the second mold chase 52 defines a second cavity 521, and the first cavity 511 is in communication with the second cavity 521 through the through hole 106 of the substrate 10. In some embodiments, the upper molding film 53 is disposed on the inner surface of the first mold chase 51 to define the first cavity 511. For example, the upper molding film 53 is applied above the first surface 101 of the substrate 10 and above the first semiconductor device 12 or on the first surface 121 of the first semiconductor device 12. Optionally, a lower molding film may be disposed on the inner surface of the second mold chase 52 to define the second cavity 521. For example, the lower molding film may be applied below the second surface 102 of the substrate 10 and below the second semiconductor device 20 or on the second surface 202 of the second semiconductor device 20.

Then, an encapsulant (or overall encapsulant) 19 (e.g., a molding compound) is introduced or applied to flow across the second surface 102 of the substrate 10 and across the first surface 101 of the substrate 10. Arrows 24 show a flow direction of the encapsulant 19. In some embodiments, the encapsulant 19 flows from an insert gate 522 across the second surface 102 of the substrate 10 (e.g., the second cavity 521), through the through hole 106 to the first surface 101 of the substrate 10, across the first surface 101 of the substrate 10 (e.g., the first cavity 511), and to an end of the upper molding film 53. An air vent hole is provided to release air as the encapsulant 19 replaces air in the enclosed volume of the first cavity 511 and the second cavity 521. In some embodiments, a portion of the second encapsulant 26 may further extend into the space between the second semiconductor device 20 and the second surface 102 of the substrate 10 to surround and protect the second interconnection elements 22 (e.g., MUF). Once the encapsulant 19 has filled the volumes of the second cavity 521 and the first cavity 511, an optional curing stage may be conducted. In some embodiments, the portion of the encapsulant 19 in the first cavity 511 forms the first encapsulant 18, and the portion of the encapsulant 19 in the second cavity 521 forms the second encapsulant 26.

A CTE of the first encapsulant 18 is defined as CTE2. A CTE of the second encapsulant 26 is defined as CTE3. In some embodiments, a thickness of the first encapsulant 18 is substantially equal to a thickness of the second encapsulant 26. In some embodiments, a difference between CTE1 and CTE2 is substantially equal to a difference between CTE1 and CTE3, such as $0.9*|CTE3-CTE1| \leq |CTE2-CTE1| \leq 1.1*|CTE3-CTE1|$, or $0.99*|CTE3-CTE1| \leq |CTE2-CTE1| \leq 1.01*|CTE3-CTE1|$. In addition, CTE2 is substantially equal to CTE3, such as $|(CTE3-CTE2)/(CTE3+CTE2)| \leq$ about 0.1, ≤about 0.05, or ≤about 0.01. In some embodiments, the semiconductor package structure 1 (e.g., as shown in FIG. 1) manufactured by the double side molding technique may exhibit a warpage in a range from about −30 micrometers (μm) (e.g., concave warpage or upward arc warpage) to about 30 μm (convex warpage or downward arc warpage) during a reflow process due to the above determined values of CTEs.

Figure 16:
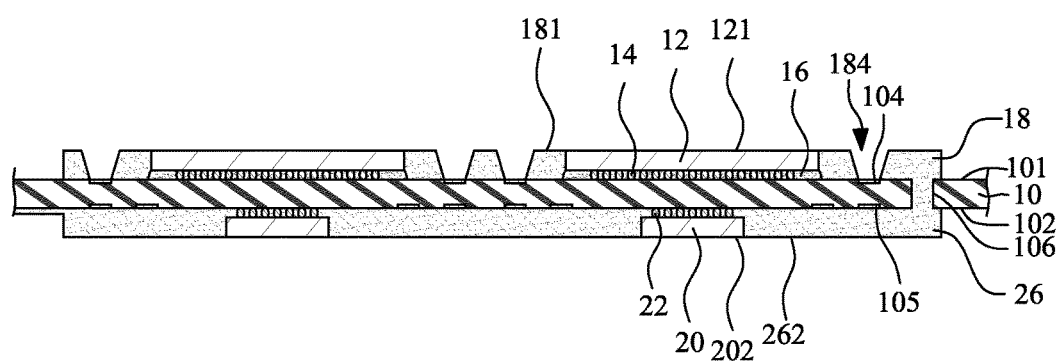

Referring to FIG. 16, the first mold chase 51, the second mold chase 52 and the upper molding film 53 are removed. The first encapsulant 18 has a first surface 181. The first surface 181 of the first encapsulant 18 is substantially coplanar with a first surface 121 of first semiconductor device 12. For example, the first semiconductor device 12 may be exposed from the first encapsulant 18. The second encapsulant 26 has a second surface 262. The second surface 262 of the second encapsulant 26 is substantially coplanar with a second surface 202 of the second semiconductor device 20. For example, the second semiconductor device 20 may be exposed from the second encapsulant 26.

Then, at least one first opening 184 is formed by, for example, a first laser ablation conducted on the first surface 181 of the first encapsulant 18. As shown in FIG. 16, the position of the first opening 184 corresponds to or substantially aligns with the position of the first connection pad 104 so as to expose the first connection pad 104. For example, the first connection pad 104 is exposed from the first encapsulant 18.

Figure 17:
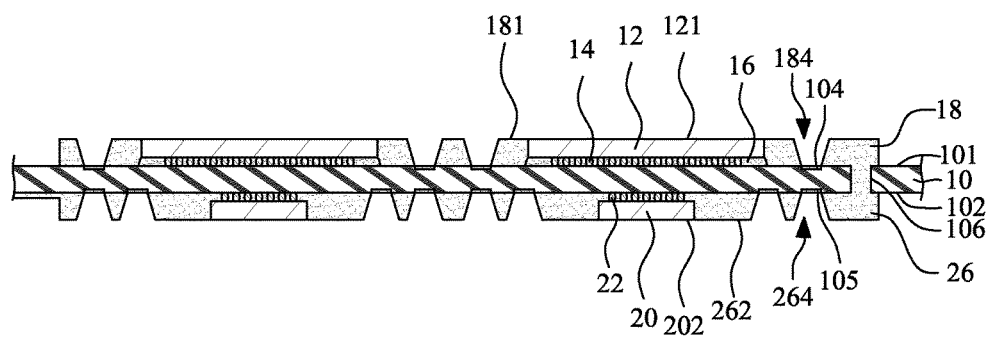

Referring to FIG. 17, at least one second opening 264 is formed by, for example, a second laser ablation conducted on the second surface 262 of the second encapsulant 26. As shown in FIG. 17, the position of the second opening 264 corresponds to or substantially aligns with the position of the second connection pad 105 so as to expose the second connection pad 105. For example, the second connection pad 105 is exposed from the second encapsulant 26.

Figure 18:
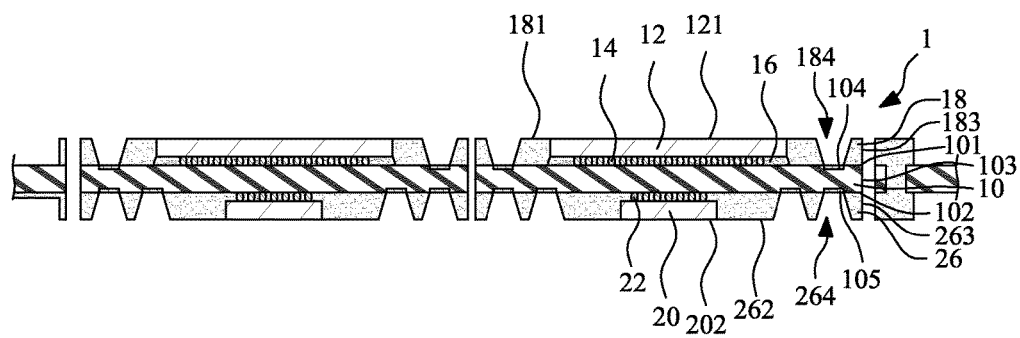

Referring to FIG. 18, a singulation process is conducted so as to obtain a plurality of individual semiconductor package structures 1 as shown in FIG. 1. After the singulation process, the side surface 183 of the first encapsulant 18, the side surface 263 of the second encapsulant 26 and the lateral surface 103 of the substrate 10 are substantially coplanar with each other.

Figure 19:
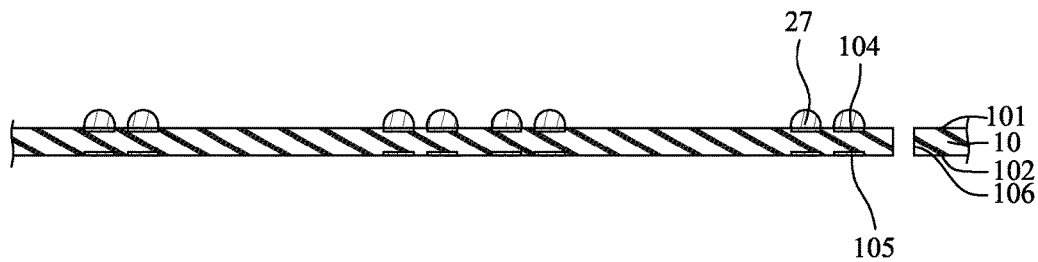
FIG. 19, FIG. 20, FIG. 21, FIG. 22, FIG. 23, FIG. 24, FIG. 25 and FIG. 26 illustrate a packaging method according to one or more embodiments of the present disclosure.

FIGS. 19-26 illustrate a packaging method according to one or more embodiments of the present disclosure. Referring to FIG. 19, a substrate 10 is provided. The substrate 10 can be a package substrate, and can have a first surface 101 and a second surface 102 opposite to the first surface 101. In addition, the substrate 10 can include at least one first connection pad 104 and at least one second connection pad 105, and can define at least one through hole 106 extending through the substrate 10. The first connection pad 104 is disposed adjacent to the first surface 101 of the substrate 10, and the second connection pad 105 is disposed adjacent to the second surface 102 of the substrate 10. The material of the substrate 10 may be an organic substrate or an inorganic substrate. For example, the material of the substrate 10 may include a glass-reinforced epoxy resin material (e.g., FR4), BT, epoxy, silicon, PCB material, glass or ceramic. A CTE of the substrate 10 is defined as CTE1.

Then, at least one first intermediate material 27 (e.g., a pre-solder or solder ball) is formed or disposed on the first connection pad 104 by, for example, printing.

Figure 20:
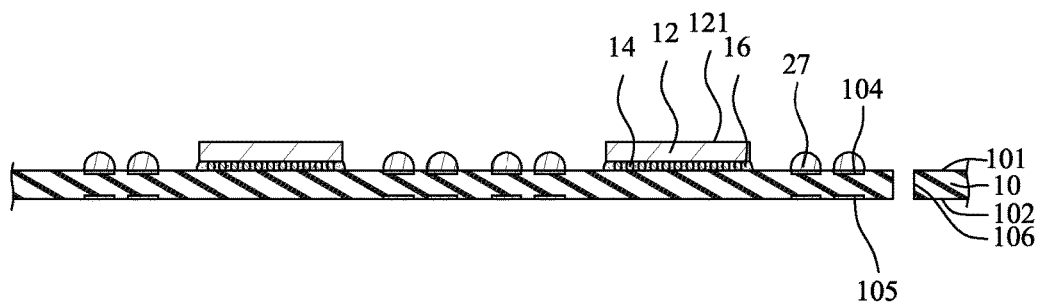

Referring to FIG. 20, a first semiconductor device 12 is mounted on the first surface 101 of the substrate 10, and is surrounded by the first intermediate material 27. In some embodiments, the first semiconductor device 12 is a semiconductor die, and is electrically connected to the first surface 101 of the substrate 10 through a plurality of first interconnection elements 14, such as bumps or pillars. For example, the first semiconductor device 12 may be attached to the first surface 101 of the substrate 10 by flip chip bonding. An underfill 16 may be optionally applied in the space between the first semiconductor device 12 and the first surface 101 of the substrate 10 to surround and protect the first interconnection elements 14. A CTE of the first semiconductor device 12 is defined as CTE4, and CTE4 is substantially equal to CTE1, such as $|(CTE4-CTE1)/(CTE4+CTE1)| \leq$ about 0.1, ≤about 0.05, or ≤about 0.01.

Figure 21:
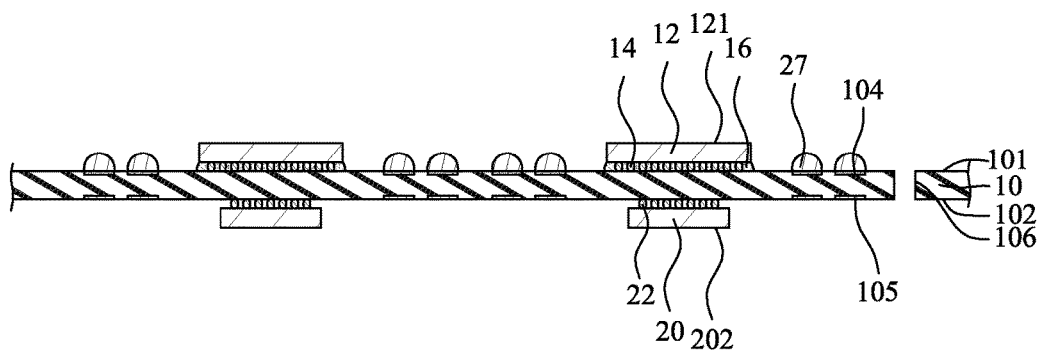

Referring to FIG. 21, at least one second semiconductor device 20 is mounted on the second surface 102 of the substrate 10. In some embodiments, the second semiconductor device 20 is a semiconductor die, and is electrically connected to the second surface 102 of the substrate 10 through a plurality of second interconnection elements 22, such as bumps or pillars. For example, the second semiconductor device 20 may be attached to the second surface 102 of the substrate 10 by flip chip bonding. In some embodiments, there may be an underfill applied in the space between the second semiconductor device 20 and the second surface 102 of the substrate 10 to surround and protect the second interconnection elements 22. A CTE of the second semiconductor device 20 is defined as CTE5, and CTE5 is substantially equal to CTE1, such as $|(CTE5-CTE1)/(CTE5+CTE1)| \leq$ about 0.1, ≤about 0.05, or ≤about 0.01.

Figure 22:
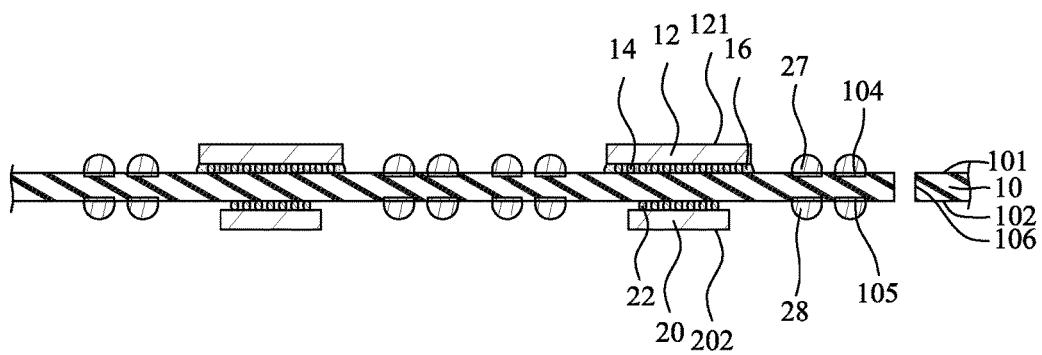

Referring to FIG. 22, at least one second intermediate material 28 (e.g., a pre-solder or solder ball) is formed or disposed on the second connection pad 105 by, for example, printing. The second intermediate material 28 surrounds the second semiconductor device 20.

Figure 23:
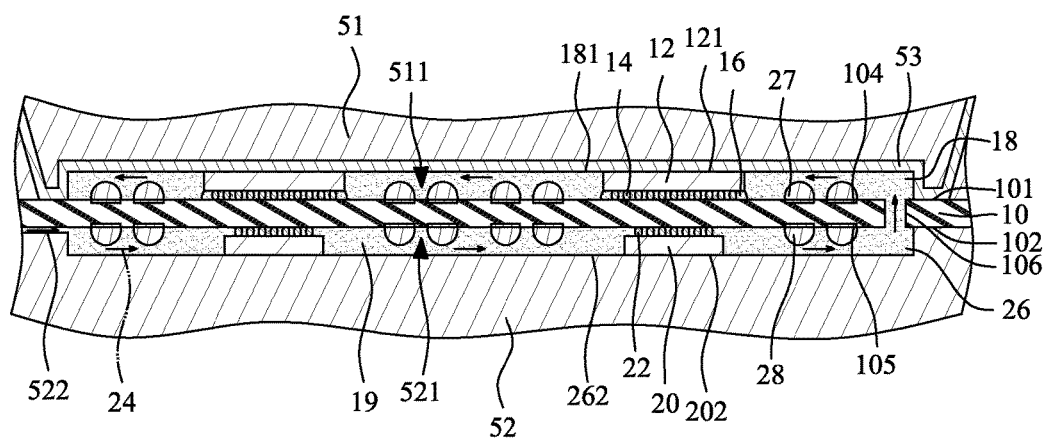

Referring to FIG. 23, a first encapsulant 18 is formed or disposed on the first surface 101 of the substrate 10 and a second encapsulant 26 is on the second surface 102 of the substrate 10. The first encapsulant 18 covers at least a portion of the first semiconductor device 12, and the second encapsulant 26 covers at least a portion of the second semiconductor device 20. In some embodiments, the first encapsulant 18 and the second encapsulant 26 are formed or disposed concurrently at one stage by the above-mentioned "double side molding" described in FIG. 15. A CTE of the first encapsulant 18 is defined as CTE2. A CTE of the second encapsulant 26 is defined as CTE3. In some embodiments, a thickness of the first encapsulant 18 is substantially equal to a thickness of the second encapsulant 26. In some embodiments, a difference between CTE1 and CTE2 is substantially equal to a difference between CTE1 and CTE3, such as $0.9*|CTE3-CTE1| \le |CTE2-CTE1| \le 1.1*|CTE3-CTE1|$, or $0.99*|CTE3-CTE1| \le |CTE2-CTE1| \le 1.01*|CTE3-CTE1|$. In addition, CTE2 is substantially equal to CTE3, such as $|(CTE3-CTE2)/(CTE3+CTE2)| \le$ about 0.1, ≤about 0.05, or ≤about 0.01.

Figure 24:
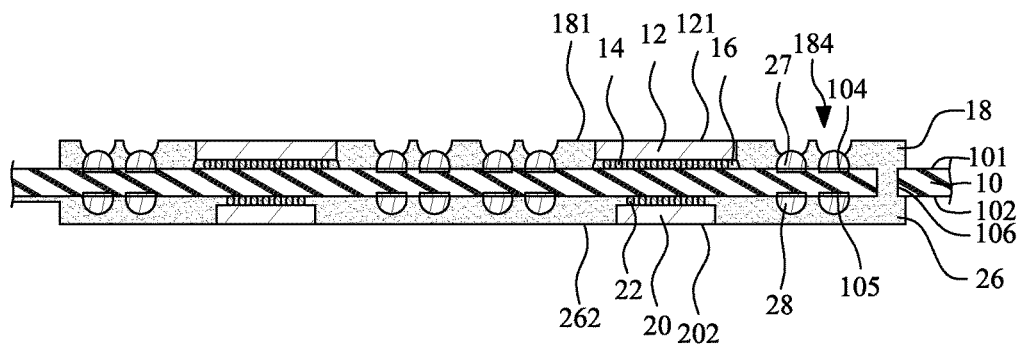

Referring to FIG. 24, at least one first opening 184 is formed by, for example, a first laser ablation conducted on the first surface 181 of the first encapsulant 18. As shown in FIG. 24, the position of the first opening 184 corresponds to or substantially aligns with the position of the first connection pad 104 and the first intermediate material 27 so as to expose the first intermediate material 27. For example, the first intermediate material 27 is exposed from the first encapsulant 18.

Figure 25:
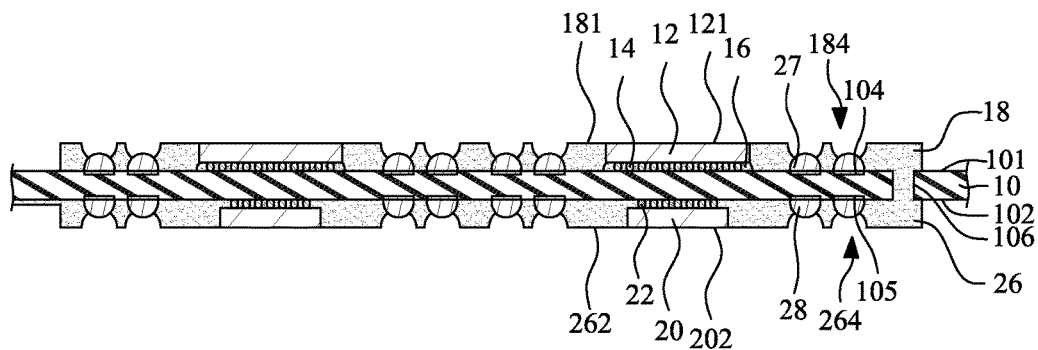

Referring to FIG. 25, at least one second opening 264 is formed by, for example, a second laser ablation conducted on the second surface 262 of the second encapsulant 26. As shown in FIG. 25, the position of the second opening 264 corresponds to or substantially aligns with the position of the second connection pad 105 and the second intermediate material 28 so as to expose the second intermediate material 28. For example, the second intermediate material 28 is exposed from the second encapsulant 26.

Figure 26:
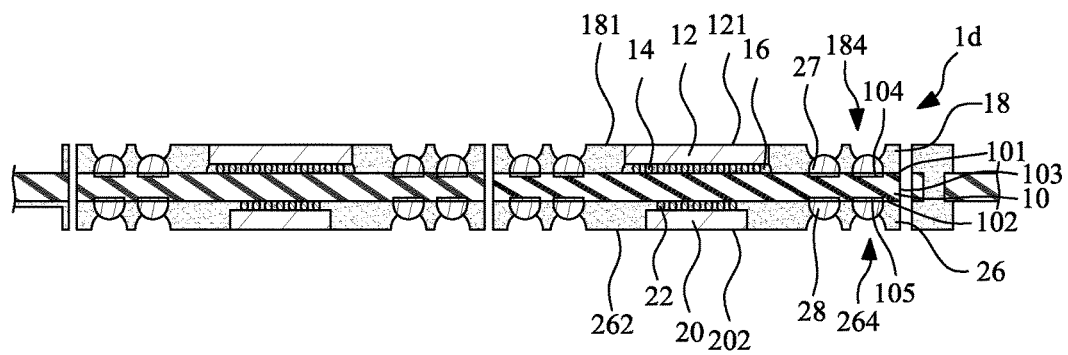

Referring to FIG. 26, a singulation process is conducted so as to obtain a plurality of individual semiconductor package structures 1d as shown in FIG. 5.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
  a substrate having a lateral surface, a first surface and a second surface opposite to the first surface and a first coefficient of thermal expansion CTE1;
  a first semiconductor device disposed adjacent to the first surface of the substrate, wherein the first semiconductor device is a semiconductor die;
  a first encapsulant having a side surface, the first encapsulant disposed on the first surface of the substrate, covering at least a portion of the first semiconductor device, and having a second coefficient of thermal expansion CTE2; and
  a second encapsulant having a side surface, the second encapsulant disposed on the second surface of the substrate and having a third coefficient of thermal expansion CTE3,
  wherein a difference between CTE1 and CTE2 is substantially equal to a difference between CTE1 and CTE3, and the side surface of the first encapsulant, the side surface of the second encapsulant and the lateral surface of the substrate are substantially coplanar.

2. The semiconductor package structure according to claim 1, wherein
  $0.9*|CTE3-CTE1| \le |CTE2-CTE1| \le 1.1*|CTE3-CTE1|$.

3. The semiconductor package structure according to claim 1, wherein CTE2 is substantially equal to CTE3.

4. The semiconductor package structure according to claim 3, wherein
  $|(CTE3-CTE2)/(CTE3+CTE2)| \le 0.1$.

5. The semiconductor package structure according to claim 3, wherein CTE2 is substantially equal to CTE1.

6. The semiconductor package structure according to claim 5, wherein
  $|(CTE2-CTE1)/(CTE2+CTE1)| \le 0.1$.

7. The semiconductor package structure according to claim 1, wherein the first semiconductor device has a fourth coefficient of thermal expansion CTE4, and CTE4 is substantially equal to CTE1.

8. The semiconductor package structure according to claim 1, further comprising a second semiconductor device disposed adjacent to the second surface of the substrate and having a fifth coefficient of thermal expansion CTE5, wherein the second encapsulant covers at least a portion of the second semiconductor device, and CTE5 is substantially equal to CTE1.

9. The semiconductor package structure according to claim 1, wherein the substrate comprises a first connection pad disposed adjacent to the first surface of the substrate and a second connection pad disposed adjacent to the second surface of the substrate, the first connection pad is exposed from the first encapsulant, and the second connection pad is exposed from the second encapsulant.

10. The semiconductor package structure according to claim 1, wherein the substrate comprises a first connection pad disposed adjacent to the first surface of the substrate, a first intermediate material disposed on the first connection pad, a second connection pad disposed adjacent to the second surface of the substrate and a second intermediate material disposed on the second connection pad, wherein the first intermediate material is exposed from the first encapsulant and the second intermediate material is exposed from the second encapsulant.

11. The semiconductor package structure according to claim 1, wherein a thickness of the first encapsulant is substantially equal to a thickness of the second encapsulant.

12. A package on package structure, comprising:
a bottom package, comprising:
a bottom substrate having a first surface and a second surface opposite to the first surface and having a first coefficient of thermal expansion CTE1;
a first semiconductor device disposed adjacent to the first surface of the bottom substrate;
a first encapsulant disposed on the first surface of the bottom substrate, covering at least a portion of the first semiconductor device, and having a second coefficient of thermal expansion CTE2; and
a second encapsulant disposed on the second surface of the bottom substrate and having a third coefficient of thermal expansion CTE3, wherein a difference between CTE1 and CTE2 is substantially equal to a difference between CTE1 and CTE3; and
a top package disposed on and electrically connected to the bottom package, and comprising:
a top substrate having a first surface and a second surface opposite to the first surface, and having a fourth coefficient of thermal expansion CTE4;
a top semiconductor device disposed adjacent to the first surface of the top substrate; and
a top encapsulant disposed on the first surface of the top substrate, covering at least a portion of the top semiconductor device, and having a fifth coefficient of thermal expansion CTE5, wherein CTE5 is substantially equal to CTE4.

13. The package on package structure according to claim 12, wherein $|(CTE5-CTE4)/(CTE5+CTE4)| \leq 0.1$.

14. The package on package structure according to claim 12, wherein CTE5 is substantially equal to CTE2, and CTE4 is substantially equal to CTE1.

15. The package on package structure according to claim 12, wherein the top semiconductor device has a sixth coefficient of thermal expansion CTE6, and CTE6 is substantially equal to CTE4.

16. The package on package structure according to claim 12, wherein a side surface of the first encapsulant, a side surface of the second encapsulant, a lateral surface of the bottom substrate, a side surface of the top encapsulant and a lateral surface of the top substrate are substantially coplanar.

17. The package on package structure according to claim 12, wherein $|(CTE6-CTE4)/(CTE6+CTE4)| \leq 0.1$.

18. The package on package structure according to claim 12, wherein $|(CTE4-CTE1)/(CTE4+CTE1)| \leq 0.1$.

19. The package on package structure according to claim 12, wherein the bottom package further comprises a second semiconductor device disposed adjacent to the first surface of the bottom substrate.

20. The semiconductor package structure according to claim 1, wherein a material of the first encapsulant is different from a material of the second encapsulant.

21. The semiconductor package structure according to claim 1, wherein a size of the first encapsulant is different from a size of the second encapsulant.

* * * * *